(12) United States Patent
Shiina

(10) Patent No.: US 7,976,612 B2
(45) Date of Patent: Jul. 12, 2011

(54) DROPLET REMOVING DEVICE AND METHOD IN PLASMA GENERATOR

(75) Inventor: Yuichi Shiina, Tokyo (JP)

(73) Assignee: Ferrotec Corporation, Tokyo (JP)

( * ) Notice: Subject to any disclaimer, the term of this patent is extended or adjusted under 35 U.S.C. 154(b) by 962 days.

(21) Appl. No.: 11/886,799

(22) PCT Filed: Mar. 24, 2006

(86) PCT No.: PCT/JP2006/306004
§ 371 (c)(1),
(2), (4) Date: Sep. 20, 2007

(87) PCT Pub. No.: WO2006/104055
PCT Pub. Date: Oct. 5, 2006

(65) Prior Publication Data
US 2009/0026067 A1 Jan. 29, 2009

(30) Foreign Application Priority Data
Mar. 25, 2005 (JP) ................. 2005-090161

(51) Int. Cl.
*B03C 1/32* (2006.01)
(52) U.S. Cl. .................................. 95/28; 96/2
(58) Field of Classification Search ........ 95/28; 96/1–3; 422/186.01; 118/621, 623; 204/157.3
See application file for complete search history.

(56) References Cited

U.S. PATENT DOCUMENTS

| | | | | |
|---|---|---|---|---|
| 4,115,078 A | * | 9/1978 | Janner et al. ................. | 95/28 |
| 4,156,832 A | * | 5/1979 | Kistemaker et al. ...... | 315/111.41 |
| 4,170,447 A | * | 10/1979 | Goldstein et al. .......... | 423/215.5 |
| 4,217,213 A | * | 8/1980 | Schuster ..................... | 210/695 |
| 5,242,587 A | * | 9/1993 | Barrington et al. ........ | 210/223 |
| 5,931,986 A | * | 8/1999 | Peurrung et al. .......... | 95/28 |
| 2004/0159232 A1 | * | 8/2004 | Mohamed ................... | 95/28 |

FOREIGN PATENT DOCUMENTS

| | | | |
|---|---|---|---|
| JP | 60-46903 A | * | 3/1985 |
| JP | 2002-008893 | | 1/2002 |
| JP | 2003-160858 | | 6/2003 |
| JP | 2005-023407 | | 1/2005 |

OTHER PUBLICATIONS

Andre Anders, Robert A. MacGill, Twist filter for the removal of macroparticles from cathodic arc plasmas, Surface & Coatings Technology, 133-134, 2000, 96-100.

\* cited by examiner

*Primary Examiner* — Richard L Chiesa
(74) *Attorney, Agent, or Firm* — DLA Piper LLP (US)

(57) ABSTRACT

A device for removing droplets in a plasma generator including a tubular traveling passage through which plasma and droplets travel under mixed state is formed, an aperture having a passing hole at an eccentric position is provided in the tubular traveling passage, and a magnetic field generator passing the plasma through the eccentric passing hole of the aperture arranged on an outer circumference of the tubular traveling passage. The plasma further passes through the eccentric passing hole of the aperture after being bent in the tubular traveling passage by a magnetic field generated from the magnetic field generator and the droplets are removed by colliding against the wall face of the aperture at the time of bending.

10 Claims, 13 Drawing Sheets

(5A)

(5B)

DROPLET REMOVING DEVICE AND METHOD IN PLASMA GENERATOR

FIELD OF THE INVENTION

The present invention relates to a droplet removing device in plasma generator by which a plasma is generated by a vacuum arc discharge performed in an arc discharge section set under a vacuum atmosphere and cathode material particles (referred to as droplets) produced subsidiarily from the cathode at a time of plasma generation are removed.

BACKGROUND ART

In general, it is known that thin film is formed on the surface of solid material in plasma and a solid surface characteristic is improved by injecting an ion. Film formed by using of a plasma including metal ion and metalloid ion can strengthen the characteristics of abrasion resistance and corrosion resistance of a solid surface, so that it is useful as protective film, optics thin film and transparent conductivity film. As an approach to generate the metal ion and the metalloid ion, there is a vacuum arc plasma method. A vacuum arc plasma is formed by an arc discharge generated between cathode and anode, namely after a cathode material evaporates from an cathode spot existing on the cathode surface, the plasma is formed by this cathode evaporation material. In addition, when a reactivity gas and/or an inert gas (rare gas) are introduced as ambient atmosphere gas, the reactivity gas and/or the inert gas also are ionized at the same time. By performing the thin film formation and the ion injection on solid surface by means of such a plasma, surface treatment process can be carried out.

Generally, in the vacuum arc discharge, vacuum arc plasma constituent particles such as cathode material ion, electron and cathode material neutral particle (including atom and molecule) are emitted from the cathode spot, and at the same time, the cathode material fine particles referred to as droplets of size of nanometer order to several hundred micron (0.01-1000μm) are also emitted. When these droplets bond to a base member surface, the uniformity of thin film formed on the base member surface is lost, and it becomes defect product of thin film.

As a method to solve above problem of droplets, there is a magnetic filter method (non-patent document 1). As shown in FIG. 12 illustrating an outlined schematic diagram of internal structure, in this magnetic filter method, the vacuum arc plasma is transported from plasma generating section 101 to plasma processing section 103 through bellows-shaped duct 102 curved to be S-shaped. According to this method, the emitted droplets D are adhesion-captured (captured) on an inner peripheral wall of bellows-shaped duct 102. In addition, curvature magnetic field is formed by means of electromagnet 104 constructed from windings disposed along duct 102, and the plasma stream is bent by said curvature magnetic field, so that plasma P is effectively moved to the plasma processing section 103.

However, there are the following problems in said magnetic filter method. Since the droplets D accumulate on the inner wall of bellows-shaped duct 102, it is necessary to remove the droplets regularly. However, the operation is not easy, because the duct 102 is formed in the shape of bellows. Additionally, though big droplets D are captured to duct 102, small droplets D flow to the plasma processing section 103 attending with plasma P and there is a danger that they bond on the surface of article being processed 105. Besides, droplets D which did not adhere to the wall surface repeat the irregular reflection by the inner surface of bellows-shaped duct 102, so that they reach the plasma processing section 103 and the similar damage is given to the surface of article being processed 105. In addition, when droplets D accumulate on the inner wall of duct 102 to thickness of around 0.5 mm, the stack thing comes off from the inner wall and it might contaminate plasma P as an impurity. Furthermore, it is technically difficult to form steel materials to bellows-shaped duct 102, and besides, there is a defect to become expensive.

In order to solve this problem, Japanese Patent Laid-Open No. 2002-8893 (patent document 1) is published and a plasma processing device shown in the outlined schematic diagram of FIG. 13 is proposed. Additionally, in FIG. 13, reference numeral Gt is a gas introduction system, numeral Gh is a gas exhaust system, and numeral V shows a power source. In this conventional plasma arc processing method, as shown in FIG. 13, a vacuum arc discharge is done under the vacuum atmosphere in which reactivity gas was introduced if necessary, so that plasma P is generated and this plasma P is flown into the plasma processing section M. The surface treatment process by plasma P is done for the article being processed 230 disposed in this plasma processing section M.

The plasma stream emitted from the plasma generation section E is bent in the almost perpendicular direction not facing the plasma generation section E by the curvature magnetic field, and is flowed into the plasma processing section M. The droplet capturing section H by which droplets are captured is arranged at the position facing the plasma generation section E. In this plasma processing method, the plasma stream is branched in the almost perpendicular direction from the droplet stream by the curvature magnetic field, and the droplet capturing section H is perfectly separated from the plasma stream passage. Therefore, the capture and removal of droplets D are done easily, and the mixture of droplets D to the plasma processing section M can be prevented.

[Patent Document 1] Japanese Patent Laid-Open No. 2002-8893

[Non-Patent Document 1] A. Anders and R. A. MacGill, Surface and Coatings Technology 133-134 (2000) 96-100

DISCLOSURE OF THE INVENTION

Problem to be Solved by the Invention

However, in this plasma processing method, there is the case that the droplets D traveling to the droplet capturing section H from the arc discharge section collide to side wall 201 of the plasma traveling passage through which the plasma P travels. After the droplets D reflected back with the side wall 201, they advance into the plasma traveling passage, so that there was the case that the droplets adhere on the surface of article being processed 230. In addition, even if big droplets D go straight and are captured by the droplet capturing section H, there are many cases that small droplets D follow with the plasma stream and flow into the plasma processing section M. As thus described, the conventional plasma processing apparatus could not separate the plasma stream and the droplets stream. Therefore, there is a possibility that the droplets D travel into the plasma traveling passage, so that it was difficult to form a film of high purity.

The present invention is done to solve the conventional problems described above, and the object of the present invention is to provide a droplet removing device in plasma generator, wherein the plasma and droplets traveling from the arc discharge section can be certainly separated, so that it is prevented that the droplets reach the article being processed.

Means to Solve the Problem

The present invention is proposed to solve the above problems. In a droplet removing device in a plasma generator by which a plasma is generated by a vacuum arc discharge which is performed in an arc discharge section under a vacuum atmosphere and cathode material particles (referred to as droplets) produced subsidiarily from a cathode at a time of plasma generation are removed, the first form of the present invention is said droplet removing device in said plasma generator characterized in that a tubular traveling passage through which said plasma and said droplets travel under a mixed state is formed, one or more aperture having a passing hole at an eccentric position is provided in said tubular traveling passage and a magnetic field generator for passing said plasma through said eccentric passing hole of said aperture is arranged on an outer circumference of said tubular traveling passage, wherein said plasma passes through said eccentric passing hole of said aperture after being curved in said tubular traveling passage by a magnetic field generated from said magnetic field generator, said droplets are separated from said plasma at the time of bending and removed by colliding against a wall face of said aperture.

The second form of the present invention is the droplet removing device in the plasma generator of said first form, wherein a plurality of said apertures are arranged in said tubular traveling passage, said eccentric passing holes next to each other are disposed for their positions to be shifted relative to each other, said droplets passing through said eccentric passing hole of an upstream side aperture with said plasma are removed by collision against said wall surface of a next aperture, so that said plasma can pass through said eccentric passing hole of said next aperture.

The third form of the present invention is the droplet removing device in the plasma generator of said first or second form, wherein said magnetic field generating means consists of a slant magnetic field generator by which a slant magnetic field is formed in a direction slanted for an axial direction of said tubular traveling passage and said plasma can pass through said eccentric passing hole of said aperture by said slant magnetic field.

The fourth form of the present invention is the droplet removing device in the plasma generator of said third form, wherein said slant magnetic field generator is formed by an electromagnet or a permanent magnet arranged in a slant shape on an outer circumferential surface of said tubular traveling passage.

The fifth form of the present invention is the droplet removing device in the plasma generator of said third form, wherein said slant magnetic field generator is constructed from a traveling magnetic field generator generating a traveling magnetic field and a radial direction magnetic field generator generating a radial direction magnetic field, so that said slant magnetic field is formed by composition of said traveling magnetic field and said radial direction magnetic field, and said plasma can pass curvedly through said eccentric passing hole of said aperture by said slant magnetic field.

The sixth form of the present invention is the droplet removing device in the plasma generator of said fifth form, wherein said radial direction magnetic field generator is composed of two sets disposed with right angle or almost right angle in X-X axial direction and Y-Y axial direction on said outer circumference of said tubular traveling passage.

The seventh form of the present invention is the droplet removing device in the plasma generator of said fifth or sixth form, wherein said traveling magnetic field generator is formed by an electromagnet arranged on said outer circumferential surface of said tubular traveling passage and said radial direction magnetic field generator is formed by a permanent magnet.

The eighth form of the present invention is the droplet removing device in the plasma generator of said fifth or sixth form, wherein said traveling magnetic field generator is formed by an electromagnet arranged on said outer circumferential surface of said tubular traveling passage and said radial direction magnetic field generator is formed by a horseshoe-shaped magnetic body wound with a coil.

The ninth form of the present invention is the droplet removing device in the plasma generator of any form of said first to eighth forms, wherein a main traveling passage is arranged at a base end side of said tubular traveling passage and a droplet traveling passage in which said droplets travel in a straight direction from said main traveling passage, is disposed, and a supplemental traveling passage is disposed to be curvedly communicated between said main traveling passage and said tubular traveling passage, so that said plasma travels curvedly in said supplemental traveling passage toward said tubular traveling passage.

In a droplet removing method in plasma generator by which a plasma is generated by a vacuum arc discharge performed in an arc discharge section set under a vacuum atmosphere and cathode material particles(referred to as droplets) produced subsidiarily from a cathode at a time of plasma generation are removed, the tenth form of the present invention is said droplet removing method in the plasma generator characterized in that an aperture having an eccentric passing hole is provided in a tubular traveling passage through which said plasma and said droplets travel under mixed state, a slant magnetic field is formed in a direction slanted for an axial direction of said tubular traveling passage, said plasma passes through said eccentric passing hole of said aperture by being curved with said slant magnetic field, so that said plasma and said droplets are separated and said droplets are removed by colliding against a wall surface of said aperture.

Effect of the Invention

According to the first form of the present invention, the apertures more than one are comprised in the tubular traveling passage and the passing hole is formed in the eccentric position of this aperture. The magnetic field of which the line of magnetic force passes the eccentric passing hole in the shape of curvature is formed by said magnetic field generating means arranged on the outer circumference of said tubular traveling passage. Since said plasma is the charged particles, this plasma coils itself around the line of magnetic force and passes curvedly through the eccentric passing hole. As the droplets traveling with plasma have no charge, the droplets go straight due to their inertia when the plasma passes curvedly through the eccentric passing hole of the aperture, so that the droplets jump out in the outside and can be removed by colliding with the wall surface of the aperture. Therefore, by removing the droplets, the surface of article being processed disposed ahead of the tubular traveling passage can be treated by only the plasma in which most of the droplets do not mix. As thus described, since the surface of article being processed can be processed by only the plasma in which most of the droplets do not mix, the film of high purity can be formed on the surface of the article being processed.

In addition, because only the aperture is arranged in the tubular traveling passage, the wall surface of the aperture on which droplets bonded to and the wall surface of the tubular traveling passage can be overhauled easily, so the operation removing the bonding droplets can be easily performed. Additionally, because only the aperture is arranged in the tubular traveling passage, the structure of the whole droplet removing device can be simplified, and it is possible to manufacture the device cheaply and easily.

According to the second form of the present invention, a plurality of apertures are disposed in the tubular traveling passage, and the positions of eccentric passing holes of the apertures next to each other are arranged to be shifted each other. Therefore, the small droplets passing through the eccentric passing hole of the first step aperture with the plasma jump out in the outside due to their inertia when the plasma passes curvedly through the eccentric passing hole, and said small droplets are removed by colliding with the wall surface of the second step aperture. When the plasma passes curvedly through the third step aperture, the small droplets traveling with the plasma can be removed. As described above, by disposing the multistage apertures, the droplets traveling with the plasma can be decreased more, so that the surface of the article being processed disposed ahead of the tubular traveling passage can be treated with the plasma of higher purity. Furthermore, when the number of apertures disposed in the tubular traveling passage is increased, the number of small droplets traveling with the plasma can be decreased, so that the purity of the plasma can be raised. In addition, the eccentric passing holes of apertures next to each other can be naturally arranged to be shifted 180 degrees in the circumferential direction, and its shifted angle can be selected from arbitrary angle such as 90 degrees and 60 degrees. Additionally, the positions of the eccentric passing holes of apertures can be formed to shift in the radial direction.

According to the third form of the present invention, as the magnetic field generating means consists of the slant magnetic field generator, there is formed the slant magnetic field of which the line of magnetic force passes curvedly through the eccentric passing hole by said slant magnetic field generator. Since the slant magnetic field is formed by the slant magnetic field generator, this slant magnetic field can be freely adjusted to be matched with said eccentric passing hole of the aperture, thus the plasma stream can be certainly guided into said eccentric passing hole.

According to the fourth form of the present invention, the slant magnetic field generator is formed by said electromagnet or said permanent magnet arranged slantingly on the outer circumferential surface of the tubular traveling passage, there can be formed the slant magnetic field of which the line of magnetic force passes curvedly through the eccentric passing hole by said electromagnet or permanent magnet disposed slantingly. In the case forming the slant magnetic field by said electromagnet, the high slant magnetic field can be formed by means of increasing the number of turns of coil. Furthermore, by changing the number of turns of said coil and the coil current, the intensity of magnetic field can easily controlled to become lower or higher. In addition, the angle of the slant magnetic field can be easily adjusted or changed by changing the slant angle of said electromagnet. Furthermore, when said electromagnet is constructed by super-conducting magnet (electromagnet with coil of super-conducting wire), it is expected that there is arranged the slant magnetic field generator of which energy loss hardly exist, so the droplet removing device whose electric power consumption is hardly can be provided. Besides, in the case that the slant magnetic field is formed by the permanent magnet, by means of adjusting the direction of the permanent magnet, the slant magnetic field can be formed to match with the eccentric passing hole of the aperture. Furthermore, by using of the permanent magnet whose magnetic force is strong, it is also possible to form the high slant magnetic field. Moreover, the positions of N pole and S pole of said permanent magnet disposed on the outer circumference of the tubular traveling passage can be chosen freely, and the N pole and S pole of said permanent magnet can be easily installed.

According to the fifth form of the present invention, said slant magnetic field is formed by composition of the traveling magnetic field generated by the traveling magnetic field generator and the radial direction magnetic field generated by the radial direction magnetic field generator. This slant magnetic field is formed at the position that the line of magnetic force passes curvedly through the eccentric passing hole. By means of increasing the radial direction magnetic field, there is formed the plasma stream that can largely curve through the eccentric passing hole, so that the plasma curving largely through the eccentric passing hole can be formed. In this case, since the plasma curves largely, many small droplets traveling with said plasma jump out in the traveling direction by their inertia, so the larger amount of droplets traveling with the plasma can be removed.

According to the sixth form of the present invention, since said radial direction magnetic field generator is composed of two sets disposed with right angle or almost right angle in X-X axial direction and Y-Y axial direction on outer circumference of said tubular traveling passage, the resultant magnetic field having the desired direction and intensity can be formed by setting the magnetic fields in the X-X and Y-Y axial directions at the predetermined strength. Therefore, there can be formed the resultant magnetic field that guides the plasma to the eccentric passing hole of the aperture. In addition, when two sets of radial direction magnetic field generator are formed by electromagnet, the direction and strength of the resultant magnetic field can be freely controlled by increasing the number of turns of the electromagnetic coil or by adjusting the coil current. Therefore, the positions of eccentric passing holes of the apertures can be set appropriately, and the resultant magnetic field matching for the position of the eccentric passing hole can be formed easily.

According to the seventh form of the present invention, since said radial direction magnetic field generator is formed by said permanent magnet, the structure can be simplified. More, since the permanent magnet generates the radial direction magnetic field from N pole to S pole, the permanent magnets corresponding to said N pole and S-pole are arranged to match for the positions of the eccentric passing holes of the aperture disposed in the tubular traveling passage, so the slant magnetic field can be formed easily.

According to the eighth form of the present invention, since said radial direction magnetic field generator is formed by the horseshoe-shaped magnetic body wound with coil, the slant magnetic field can be generated with high efficiency. Furthermore, the direction of the slant magnetic field can be adjusted freely by moving said horseshoe-shaped magnetic body installed on the tubular traveling passage in the circumferential direction. Therefore, the direction of said horseshoe-shaped magnetic body is adjusted depending on the position of the eccentric passing hole of the aperture in the tubular traveling passage, the slant magnetic field that guides the plasma to the position of the eccentric passing hole can be formed. In addition, by increasing the number of turns of coil wound around the horseshoe-shaped magnetic body, the strong slant magnetic field can be formed. The intensity of the slant magnetic field can be controlled freely by changing the coil current.

According to the ninth form of the present invention, since the droplets go straight from main traveling passage to droplet traveling passage, the large droplets mixed with the plasma can be separated from said plasma and captured. Therefore, droplets traveling with the plasma that advances curvedly through the supplemental traveling passage can be decreased. Furthermore, the small droplets remaining after said decrease can be removed almost entirely by means of the aperture in the tubular traveling passage. Consequently, the plasma with higher purity can be obtained, thus the surface of the article being processed can be treated with the plasma of said higher purity.

According to the tenth form of the present invention, the slant magnetic field oblique for axial direction of the tubular traveling passage is formed at the position of the eccentric passing hole. Since the line of magnetic force passes curvedly through the eccentric passing hole, the plasma passes curvedly through said eccentric passing hole, winding around said line of magnetic force. When the plasma passes curvedly through the eccentric passing hole, small droplets go straight and jump out due to their inertia, and are removed by colliding with the wall surface of the aperture. That is to say, by branching small droplets from the plasma, said small droplets can be certainly removed by colliding with the wall surface of the aperture. Therefore, the plasma passing through the eccentric passing hole of the aperture can become the plasma of high purity not mixed with droplets. Because the plasma passing curvedly through the eccentric passing hole does not contain the droplets, it is possible to raise up the purity more. Furthermore, it is possible to treat the surface of the article being processed by this highly purified plasma with high accuracy.

FIG. (5A) is an explanatory diagram of the radial direction magnetic field due to the horseshoe-shaped magnetic body wound with coil, and (5B) is a sectional outlined diagram of the tubular traveling passage on which two sets of horseshoe-shaped magnetic body forming the radial direction magnetic field are disposed with right angle or almost right angle in X-X axial direction and Y-Y axial direction.

Figure 6:
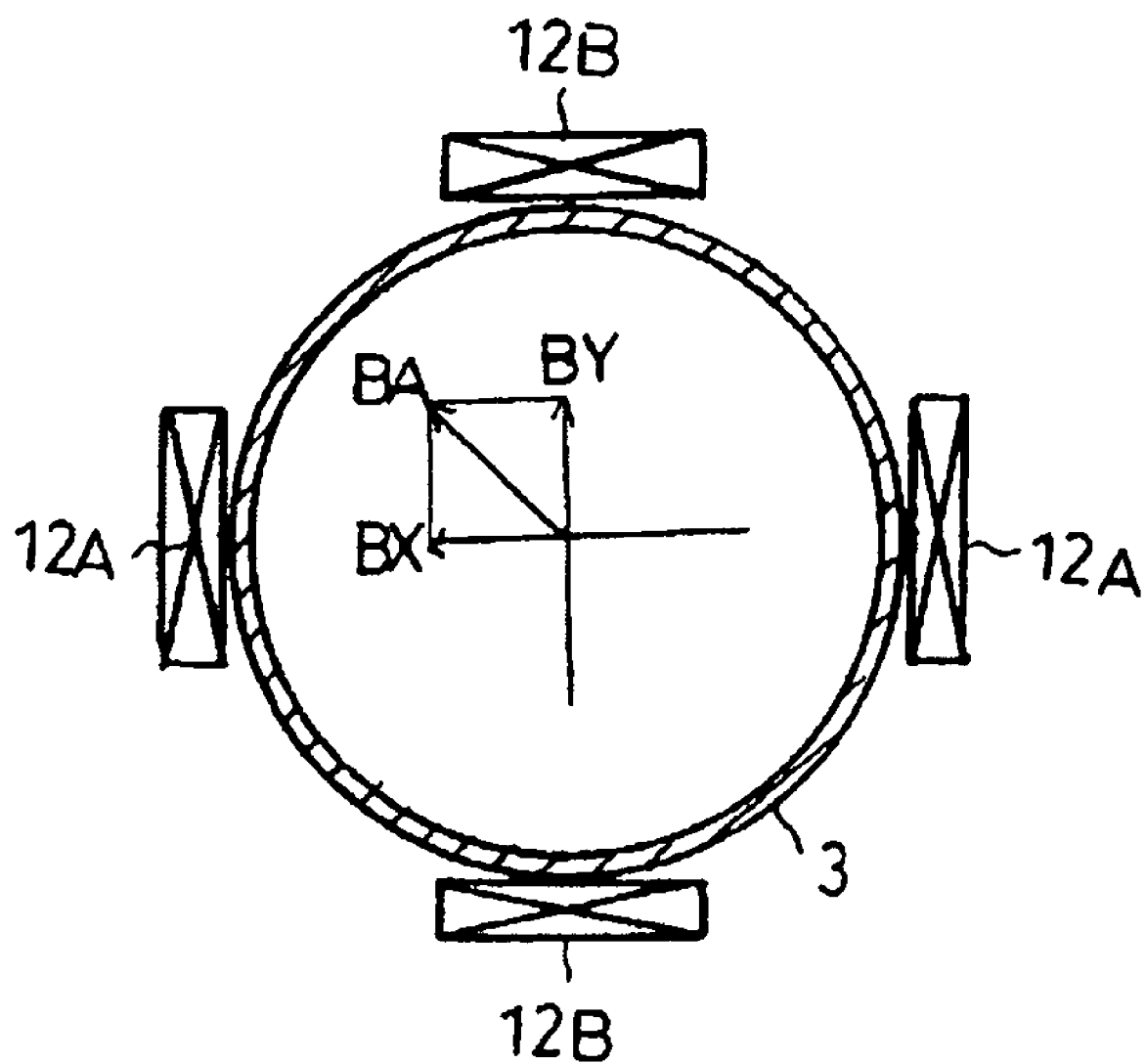

FIG. 6 is a sectional outlined diagram of the tubular traveling passage on which two sets of radial direction electromagnet forming the radial direction magnetic field are disposed with right angle or almost right angle in X-X axial direction and Y-Y axial direction.

Figure 7:
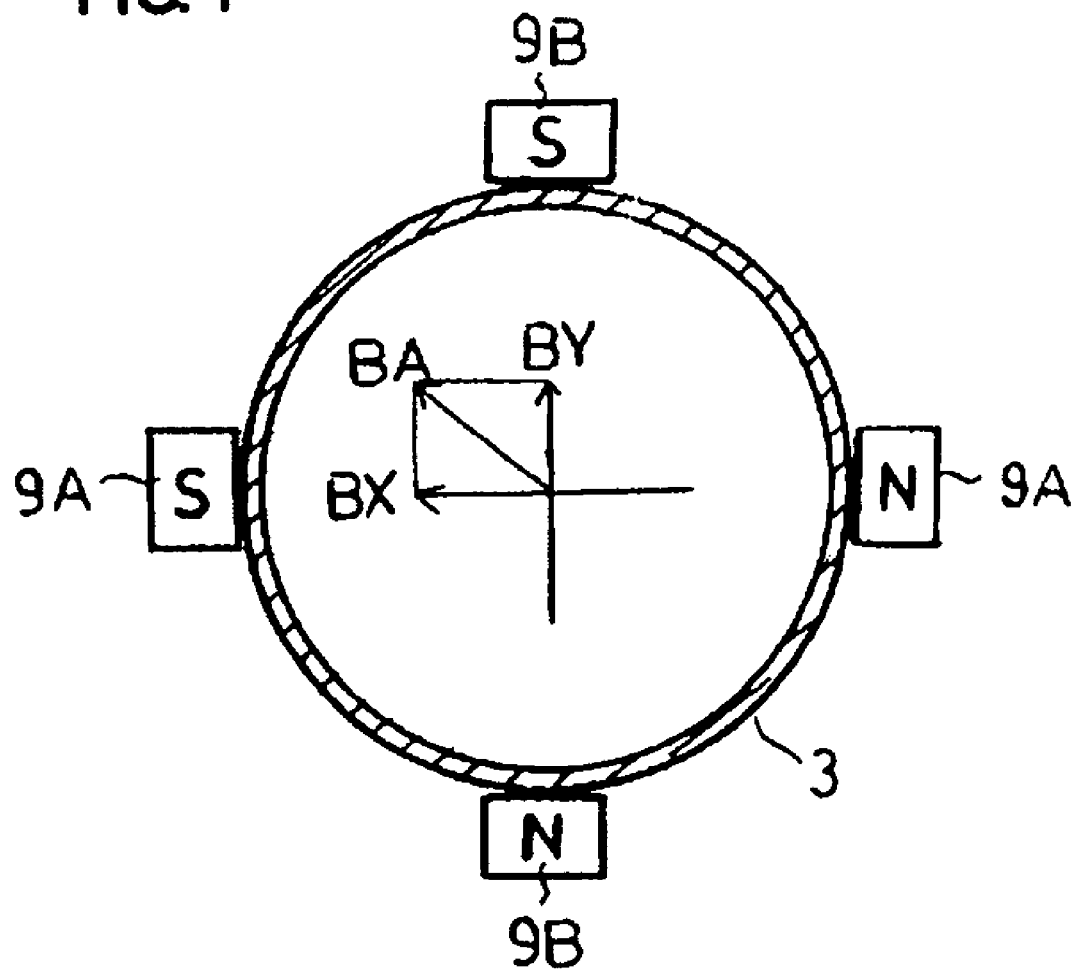

FIG. 7 is a sectional outlined diagram of the tubular traveling passage on which two sets of permanent magnet forming the radial direction magnetic field are disposed with right angle or almost right angle in X-X axial direction and Y-Y axial direction.

Figure 8:
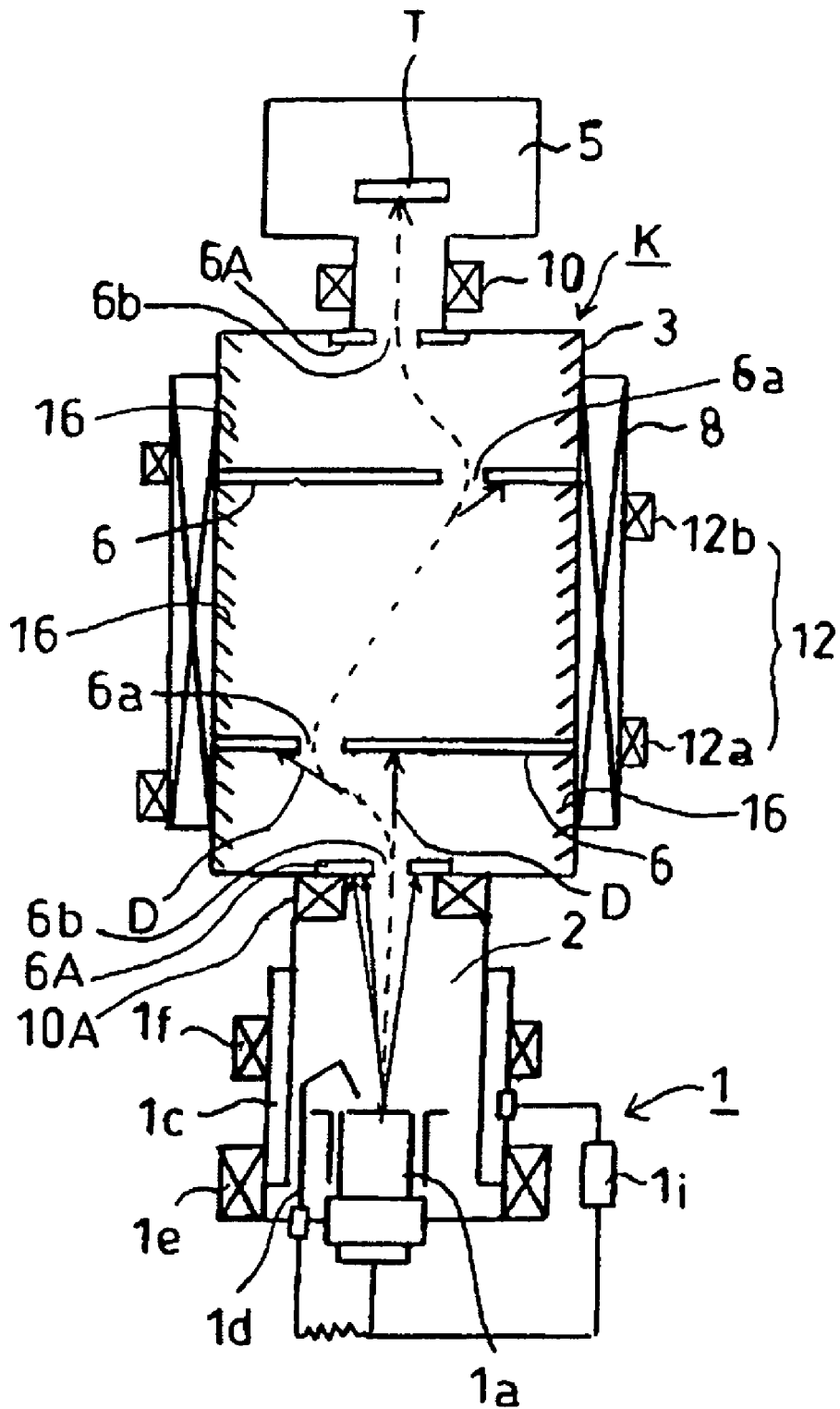

FIG. 8 is a sectional schematic diagram showing the plasma generator including the droplet removing device of the second embodiment.

Figure 9:
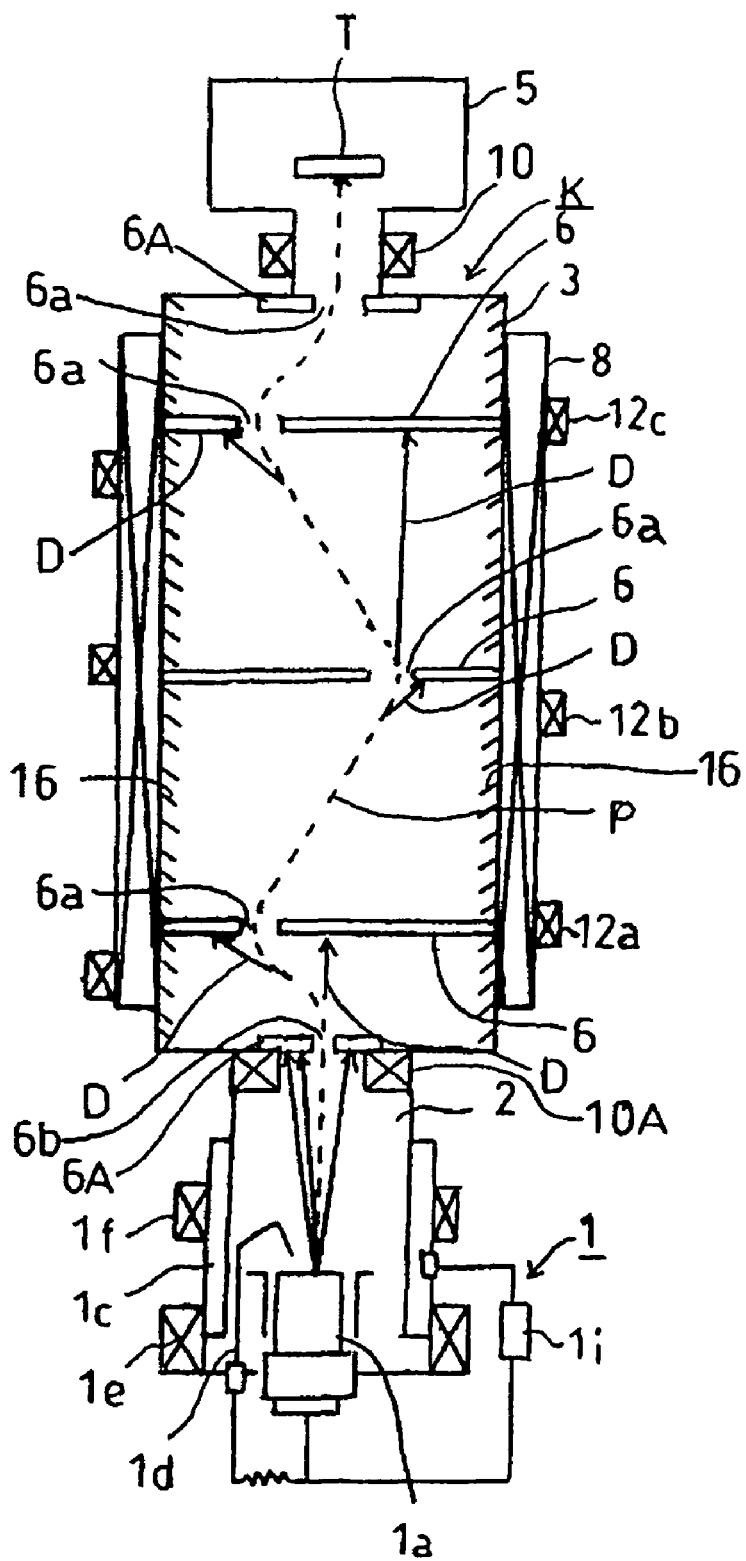

FIG. 9 is a sectional schematic diagram showing the plasma generator including the droplet removing device of the third embodiment.

Figure 10:
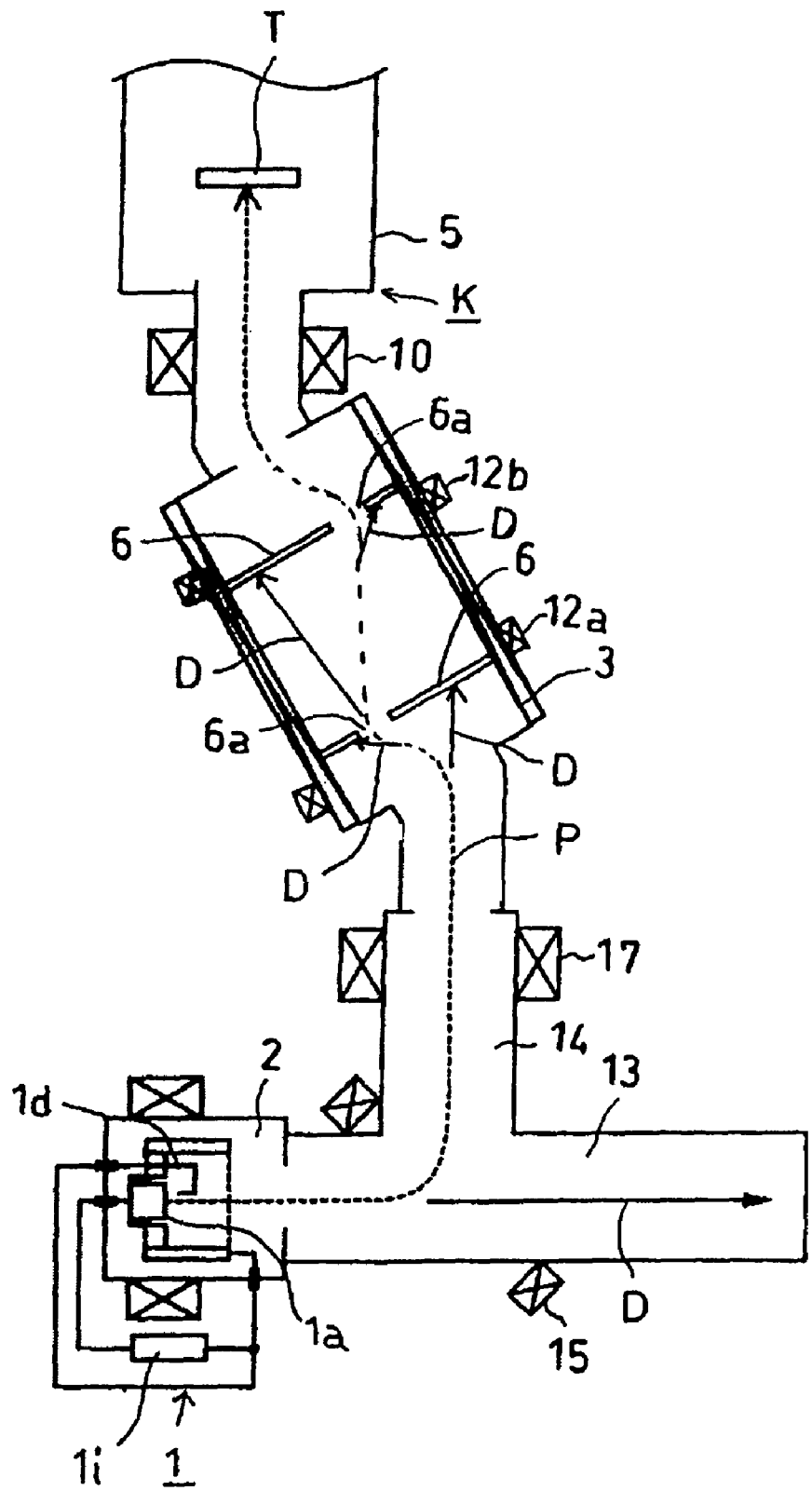

FIG. 10 is a sectional schematic diagram showing the plasma generator including the droplet removing device of the fourth embodiment.

Figure 11:
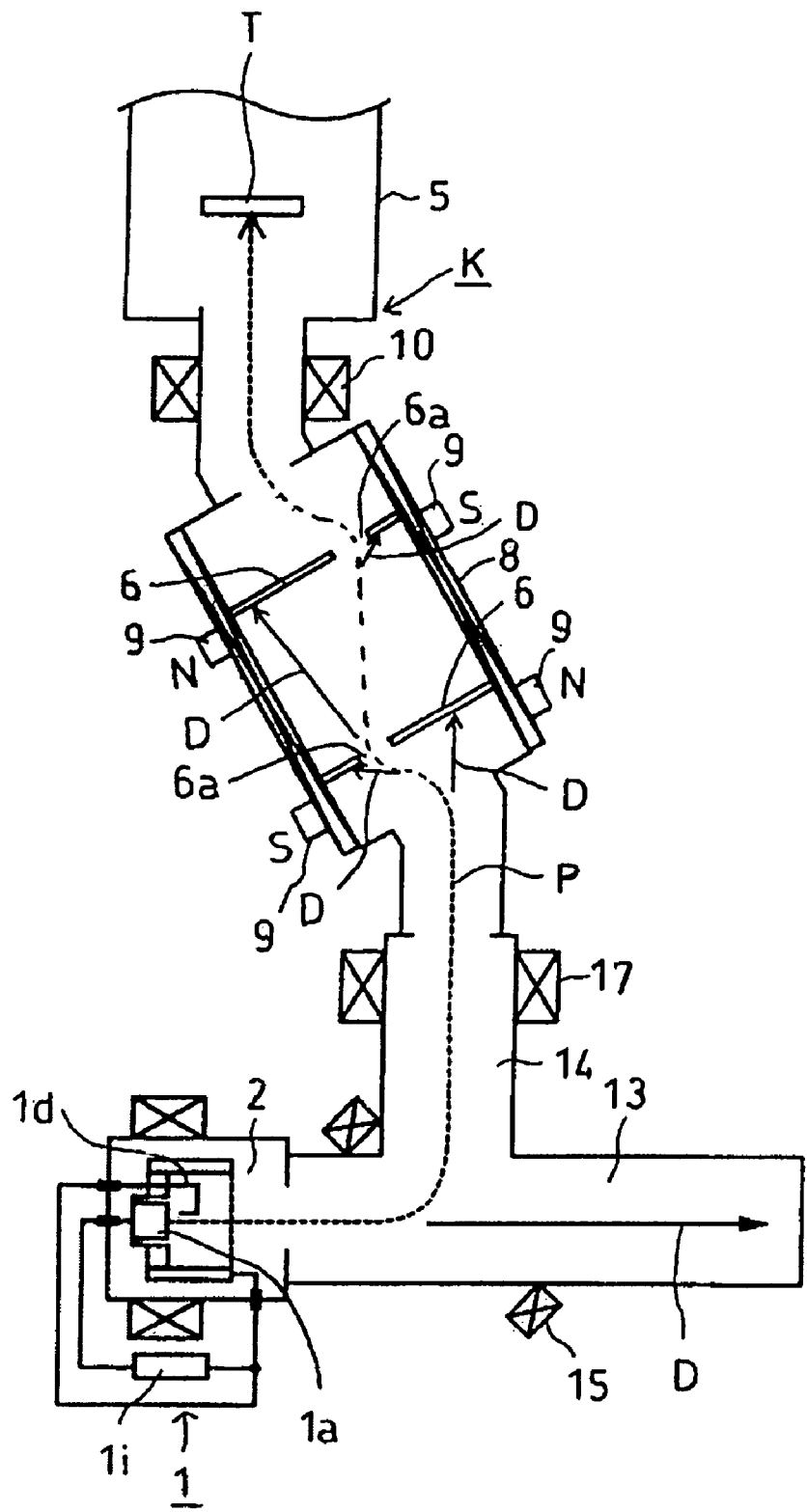

FIG. 11 is a sectional schematic diagram showing the plasma generator including the droplet removing device of the fifth embodiment.

Figure 12:
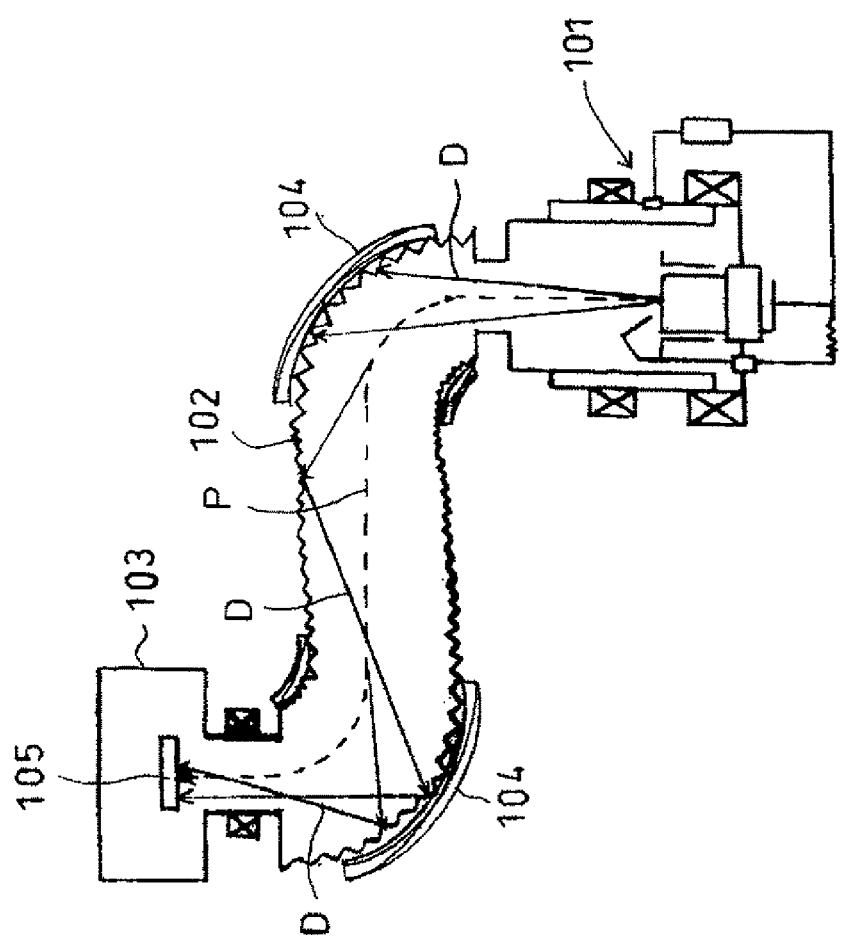

FIG. 12 is a sectional schematic diagram showing the internal structure of the plasma generator used in the conventional magnetic filtering method.

Figure 13:
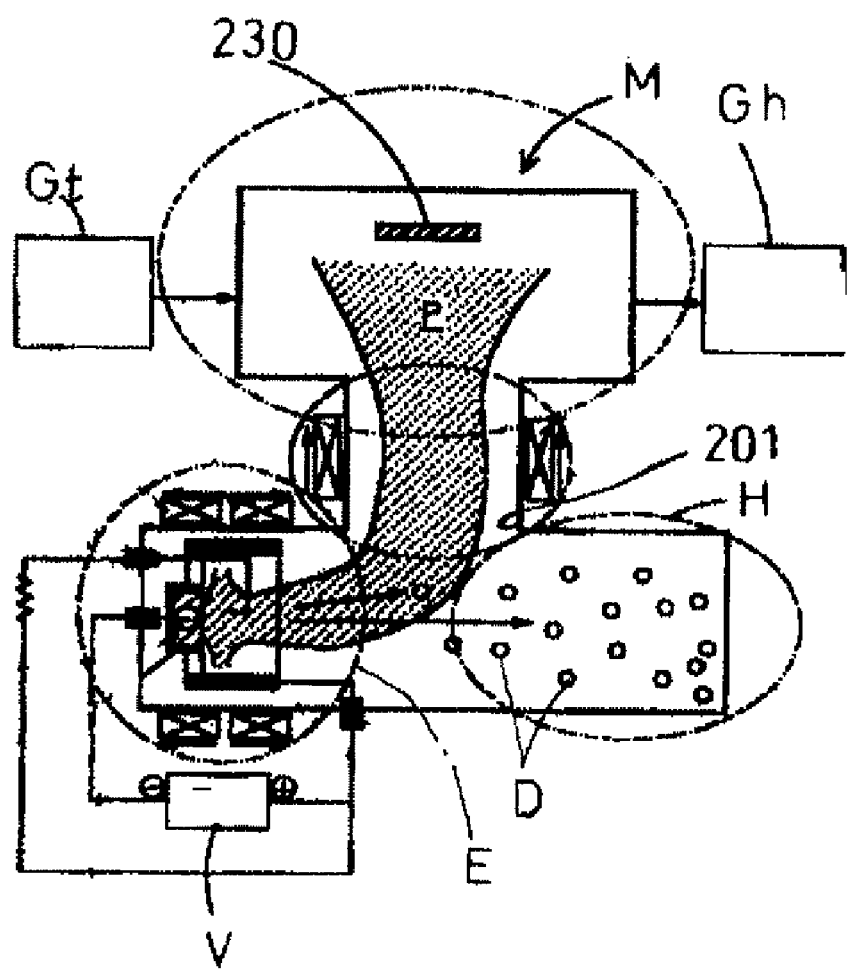

FIG. 13 is a sectional schematic diagram of the plasma processing device used in the conventional plasma processing method.

DENOTATION OF REFERENCE NUMERALS

T particle being processed
P plasma
D droplet
K container body
B1 traveling magnetic field
B2 radial direction magnetic field
B slant magnetic field
BX radial direction magnetic field
BY radial direction magnetic field
BA resultant magnetic field
1 arc discharge section
1$a$ cathode
1$b$ cathode protector
1$c$ anode
1$d$ trigger electrode
1$e$ arc stabilization magnetic field generator
1$f$ arc stabilization magnetic field generator
1$h$ insulation introduction terminal
1$i$ arc power supply
1$m$ resistance for limitation
2 main traveling passage
3 tubular traveling passage
4 droplet removing device
5 plasma processing section
6 aperture 6$a$ eccentric passing hole
6A aperture
6$b$ central passing hole
7 slant magnetic field generator
8 electromagnet
9 permanent magnet
10 electromagnet
10A electromagnet
11 horseshoe-shaped magnetic body
11$a$ main body section
11$b$ coil
12 slant electromagnet
12$a$ slant electromagnet
12$b$ slant electromagnet
12$c$ slant electromagnet
13 droplet traveling passage
14 supplemental traveling passage
15 electromagnet for bending
16 droplet baffle
17 electromagnet for traveling

BEST MODE FOR CARRYING OUT THE INVENTION

Figure 1:
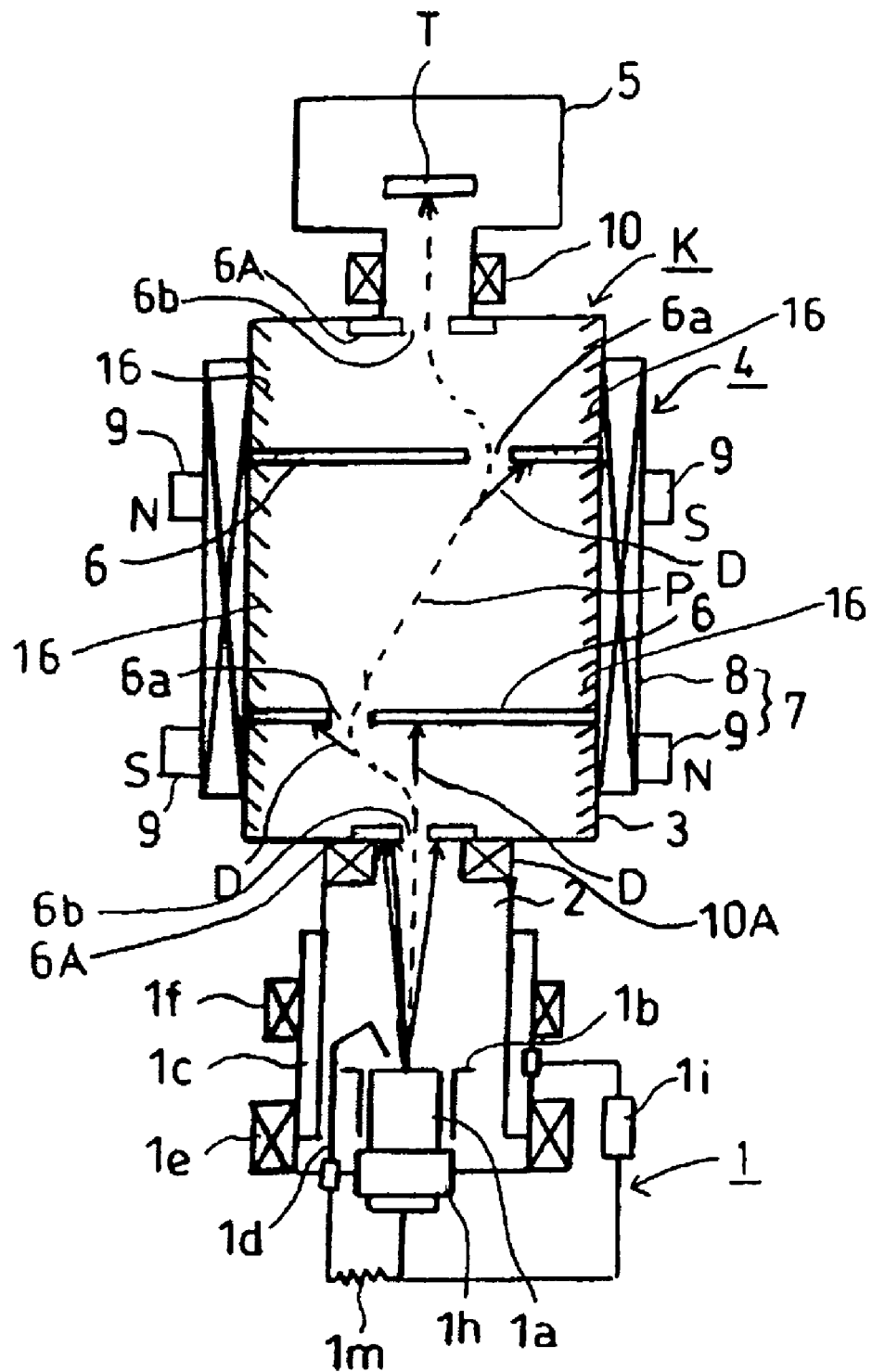
FIG. 1 is a sectional schematic diagram of the first embodiment of the plasma generator including the droplet removing device concerning the present invention.

As follows, the preferred embodiments of the droplet removing device in plasma generator concerning the present invention are explained in details based on FIG. 1 to FIG. 11. FIG. 1 is a sectional schematic diagram of the first embodiment of the plasma generator including the droplet removing device concerning the present invention. When the plasma processing section is added to this apparatus, the plasma processing device is completed.

As shown in FIG. 1, the plasma generator including the droplet removing device of this first embodiment can be assembled as the plasma processing device by integrating with the plasma processing section 5 containing the article being processed T. In the plasma processing method using this plasma processing device, the plasma P is generated generally by performing the vacuum arc discharge under vacuum atmosphere, the plasma P is transported to the plasma processing section 5, and the article being processed T arranged in this plasma processing section 5 is received the surface treatment process by said plasma P. Furthermore, the reactivity gas can be introduced into said plasma processing method if necessary. In addition, for the plasma generator including the droplet removing device explained in the second to fifth embodiments described later, this plasma processing method has fundamentally the similar construction, and the plasma processing device including the plasma processing section 5 is called as the plasma generator.

The constituent particles of plasma P contain not only the evaporation material from cathode 1a of arc discharge section 1, or the charged particle (ion, electron) generated by ionizing evaporation material and introduction gas, but also the neutral particle of molecule and atom of pre-plasma state. As the conditions of vaporization in plasma processing method, electric current: 1-600A (preferably 5-500A, more preferably 10-150A). Furthermore, the voltage is 5-100V (preferably 10-80V, more preferably 10-50V), and pressure: $10^{-10}$-$10^{2}$ Pa (preferably $10^{-6}$-$10^{2}$ Pa, more preferably $10^{-5}$-$10^{1}$ Pa).

The plasma generator including the droplet removing device shown in FIG. 1 comprises arc discharge section 1 formed in vacuum chamber K, and main traveling passage 2 in which plasma P and droplets D generated in said arc discharge section 1 propagate in a mixed state. Furthermore, said plasma generator includes the droplet removing device 4 providing the tubular traveling passage 3 communicating with said main traveling passage 2. Moreover, said plasma generator includes the plasma processing section 5 which performs the surface treatment process of article being processed T by the plasma P advancing through the tubular traveling passage 3 of droplet removing device 4.

Arc discharge section 1 comprises cathode 1a, cathode protector 1b, anode 1c, trigger electrode 1d, and arc stabilization magnetic field generator (electromagnetic coil or magnet) 1e, 1f. Said cathode 1a is a source supplying the main constituent material of plasma P, and the formation material is not particularly limited if a solid having electro-conductivity. Said formation material is selected from metal simple substance, alloy, inorganic simple substance, inorganic compound (metal oxide/nitride) without asking particularly, and they can be used as one kind or mixture of more kinds.

As metal simple substance, there are Al, Ti, Zn, Cr, Sb, Ag, Au, Zr, Cu, Fe, Mo, W, Nb, Ni, Mg, Cd, Sn, V, Co, Y, Hf, Pd, Rh, Pt, Ta, Hg, Nd, Pb and so on. In addition, as alloy (metal compound), there are TiAl, AlSi, NdFe and so on. Additionally, as inorganic simple substance, there are C, Si and so on. Moreover, as inorganic compound (ceramics), there are oxides such as $TiO_2$, ZnO, $SnO_2$, ITO (Indium-Tin-Oxide: indium oxide mixed with tin), $In_2O_3$, $Cd_2SnO_4$ and CuO. Furthermore, there are also nominated carbide and nitride such as TiN, TiAlC, TiC, CrN and TiCN.

Said cathode protector 1b is a tool by which a part except for the cathode surface to be evaporated is covered with electrical insulation, and it is prevented that vacuum arc plasma generated between cathode 1a and anode 1c diffuses backward. General-purpose heat resistant ceramics can be employed as said cathode protector 1b. In addition, when an electrical insulating layer (merely, gap, ceramics or fluoric resin is sandwiched) is formed between cathode 1a and protector, general-purpose stainless steel or aluminum alloy can be employed. Additionally, said cathode protector 1b is preferable in carbon material of low conductivity (amorphous carbon and teflon impregnation carbon(trademark) of treatment temperature around 800-2000° C.).

In addition, said cathode protector 1b can be formed by heat-resistant ferromagnetic material such as iron and ferrite instead of stainless steel. If it is done so, the cathode protector 1b in itself can be magnetized by magnetic field applied by arc stabilization magnetic field generator 1e and/or 1f disposed in the outside of vacuum chamber, so that it directly acts on plasma P. As thus described, adjustment of generated plasma distribution becomes easy.

The formation material of anode 1c is a solid with electro-conductivity and non-magnetism, which does not evaporate in temperature of plasma P and other properties are not limited particularly. Said formation material is selected from metal simple substance, alloy, inorganic simple substance, inorganic compound (metal oxide/nitride) without asking particularly, and they can be used as one kind or mixture of more kinds. The material employed in the above-mentioned cathode is chosen appropriately and can be used. In the first embodiment, the anode 1c is formed by stainless steel, copper or carbon material (graphite) and so on, and it is desirable to install the cooling mechanism such as water cooling type and air cooling type.

In addition, the shape of anode 1c is not limited particularly if it is not a thing obstructing total traveling of arc plasma. As shown in the diagram, its shape is the pipe body (barrel or angle pipe is not asked), but it is preferable even in coil-shape and U-shape, and besides, they may be arranged to become a couple parallel in top and bottom/right and left. Furthermore, said anode may be arranged in one place or plural places of top and bottom/right and left.

Trigger electrode 1d is the electrode to induce vacuum arc between cathode 1a and anode 1c. That is to say, said trigger electrode 1d is temporarily contacted with the surface of cathode 1a, and by separating it after that, the electric spark is generated between said cathode 1a and said trigger electrode 1d. When the electric spark is generated, electric resistance between cathode 1a and anode 1c decreases and the vacuum arc occurs between cathode and anode. As the formation material of trigger electrode 1d, there is used the general-purpose high melting point metal such as Mo (melting point: 2610° C.) and W (melting point: 3387° C.). In addition, trigger electrode 1d is formed from carbon material, preferably graphite.

Arc stabilization magnetic field generator 1e and 1f are disposed on the outer circumference of vacuum chamber K in arc discharge section 1, and they stabilize the cathode point of vacuum arc and the plasma P generated by arc discharge. When the arc stabilization magnetic field generator 1e and 1f are disposed for the purpose that the applied magnetic fields for the plasma become reverse directions (cusp-shape) each other, the plasma P becomes more stable. When the drawing efficiency of plasma P is given priority, or when the anode facing the cathode is disposed at the position at which traveling of the plasma is not disturbed, they can be disposed for the purpose that the applied magnetic fields for the plasma become the same directions (mirror-shape) each other. Additionally, although the arc stabilization magnetic field generator 1e is arranged on the outer circumference of container body K in FIG. 1, it can be disposed near the insulation introduction terminal 1h of cathode 1a at the end portion of said container body K.

By this cusp-shaped applied magnetic field, the motion of arc cathode point can be controlled, the current path between the cathode and the anode can be secured through diffusing the plasma P in the emission direction (namely, flat cylindrical shape) and the arc discharge is stabilized. In addition, for said magnetic field generator 1e and 1f, an electromagnet (electromagnetic coil) or a permanent magnet is usually employed. Said cathode 1a, anode 1c and trigger electrode 1d are connected to the arc power supply 1i through insulation introduction terminal 1h. As said arc power supply 1i, there are used a general-purpose direct current power supply, a pulse power supply, or a pulse power supply coupled with direct current. Besides, the resistance for limitation (1-10 Ω) lm for limiting (adjusting) the current flowing to the trigger electrode 1d is usually interposed between said trigger electrode 1d and said arc power supply 1i.

In the plasma processing section (treating section), there is a case that the gas introduction is not done, but the gas introduction system (not shown in diagram) and the gas exhaust system (not shown in diagram) may be connected. A general-purpose device can be employed for these systems. It is assumed that the degree of vacuum of the whole container (pressure) is controlled to be constant by controlling the gas introduction flow and the exhaust flow to be constant.

An introduction gas may be introduced from said arc discharge section 1 or said plasma processing section 5, or said gas may be introduced from both of said plasma processing section 5 and said arc discharge section 1. When it is introduced from both of said arc discharge section 1 and said plasma processing section 5, their kinds of gas may be different. And, in the case that a reactivity gas is not employed, the rare gas (usually, Ar, He) as the introduction gas is used to hold the pressure constant, and in other case, said reactivity gas can be used appropriately.

When this reactivity gas reacts with the evaporation particle (plasma P particle) generated from source such as cathode material, the double compound film can be formed easily. As reactivity gas, it is possible to employ appropriately one kind or plural kinds selected from a group of nitrogen ($N_2$), oxygen ($O_2$), hydrogen ($H_2$), hydrocarbon gas ($C_2H_2$, $C_2H_4$, $CH_4$, $C_2H_6$ and so on), and carbon oxide gas ($CO$, $CO_2$). Here, in order to control the reactivity, it is possible to adjust the concentration of said reactivity gas by mixing said rare gas. In addition, it is possible to employ the vapor of alcohol, organic metal gas or organic metal liquid etc. as said reactivity gas.

In this plasma processing device comprising said fundamental structure, the plasma P after emission moves curvedly in the droplet removing device 4 possessing the tubular traveling passage 3 toward the plasma processing section 5 by magnetic field induction. In this process, the droplets D occurring from the cathode 1a at the generation time of plasma P are colliding with the wall surface of the aperture 6 disposed in the tubular traveling passage 3, so that they are removed.

The droplets D occurring from the cathode are electrically neutral, and have the property of straight traveling because they do not usually receive the effect of magnetic field. In this first embodiment as shown in FIG. 1, two apertures having the passing hole 6a at the eccentric position are arranged in front and back of the tubular traveling passage 3 of the droplet removing device 4. Additionally, in starting end and termination end of the tubular traveling passage 3, there are arranged the apertures 6A, 6A having the central passing hole 6b. Furthermore, in the communication path connecting the main traveling passage 2 with the tubular traveling passage 3, there is disposed the electromagnet 10A to forward the plasma P toward the tubular traveling passage 3. In addition, many droplet baffles 16 are arranged on the wall surface in the tubular traveling passage 3.

When the plasma P goes straight from the main traveling passage 2 to the tubular traveling passage 3, one part of the droplets D mixing in the plasma P are colliding with the wall surface of aperture 6A arranged at the starting end, and then are removed. In addition, the plasma P penetrating in the tubular traveling passage 3 is guided by the slant magnetic field generated by the slant magnetic field generator 7, and it advances passing curvedly through the eccentric passing hole 6a of the aperture 6, but the big droplets D go straight, so that they collide with the wall surface of the aperture 6 and are removed. Moreover, when the plasma P passes curvedly through the eccentric passing hole 6a of the aperture 6, the small droplets traveling with the plasma P jump out in the outside, and they collide with the wall surface of the aperture 6 so that they are removed.

In this first embodiment, the slant magnetic field generator 7 is constructed by the electromagnet 8 generating the traveling magnetic field disposed on the outer circumferential surface of the tubular traveling passage 3 and the permanent magnet 9 generating the radial direction magnetic field disposed on the outer circumference of said electromagnet 8. The slant magnetic field is formed by composition of the traveling magnetic field due to the electromagnet 8 and the radial direction magnetic field due to the permanent magnet 9, and the plasma P is guided by said slant magnetic field, so that the plasma P passes curvedly through the eccentric passing hole 6a of the aperture 6.

In FIG. 1, the eccentric passing hole 6a is formed at the left side in the aperture 6 of the starting end side (upstream side), and the eccentric passing hole 6a is formed at the right side in the aperture 6 of the termination end side (downstream side). In addition, the permanent magnet 9 of the starting end side has the N pole at the right side in said diagram, and the permanent magnet 9 of the termination end side has the N pole at the left side and the S pole at the right side in said diagram. Therefore, the radial direction magnetic field flowing from the right side to the left side is formed at the starting end side of the tubular traveling passage 3, and the radial direction magnetic field flowing from the left side to the right side is formed at the termination side. By composition of said traveling magnetic field and the radial direction magnetic field due to the electromagnet 8, the slant magnetic field leaning to the left is generated at the starting end side of the tubular traveling passage 3, and the slant magnetic field leaning to the right is generated at the termination end side. The plasma P going straight from the main traveling passage 2 is guided by the slant magnetic field leaning to the left at the starting end side of the tubular traveling passage 3, so that the plasma P is curved to the left and passes the eccentric passing hole 6a of the aperture 6 at the starting end side. The plasma P is guided by the slant magnetic field leaning to the right at the termination end side, so that the plasma P is curved to the right and passes the eccentric passing hole 6a of the aperture 6 at the termination end side.

Big droplets D going straight through the central passing hole 6b of the aperture 6A disposed at the starting end side of the tubular traveling passage 3 from the main traveling passage 2 collide with the wall surface of the aperture 6 of the starting end side and are removed. In addition, small droplets D traveling with the plasma P jump out in the outside by curving of the plasma P, so that they collide with the wall surface of the apertures 6,6 of the starting end side and the termination end side, and are removed. Therefore, the surface of the article being processed T in the plasma processing section 5 can be treated with the plasma P of high purity that does not include droplets D. Additionally, in the communicating path connecting the tubular traveling passage 3 with the plasma processing section 5, there is disposed the electromagnet 10 to forward the plasma P to the plasma processing section 5.

Figure 2:
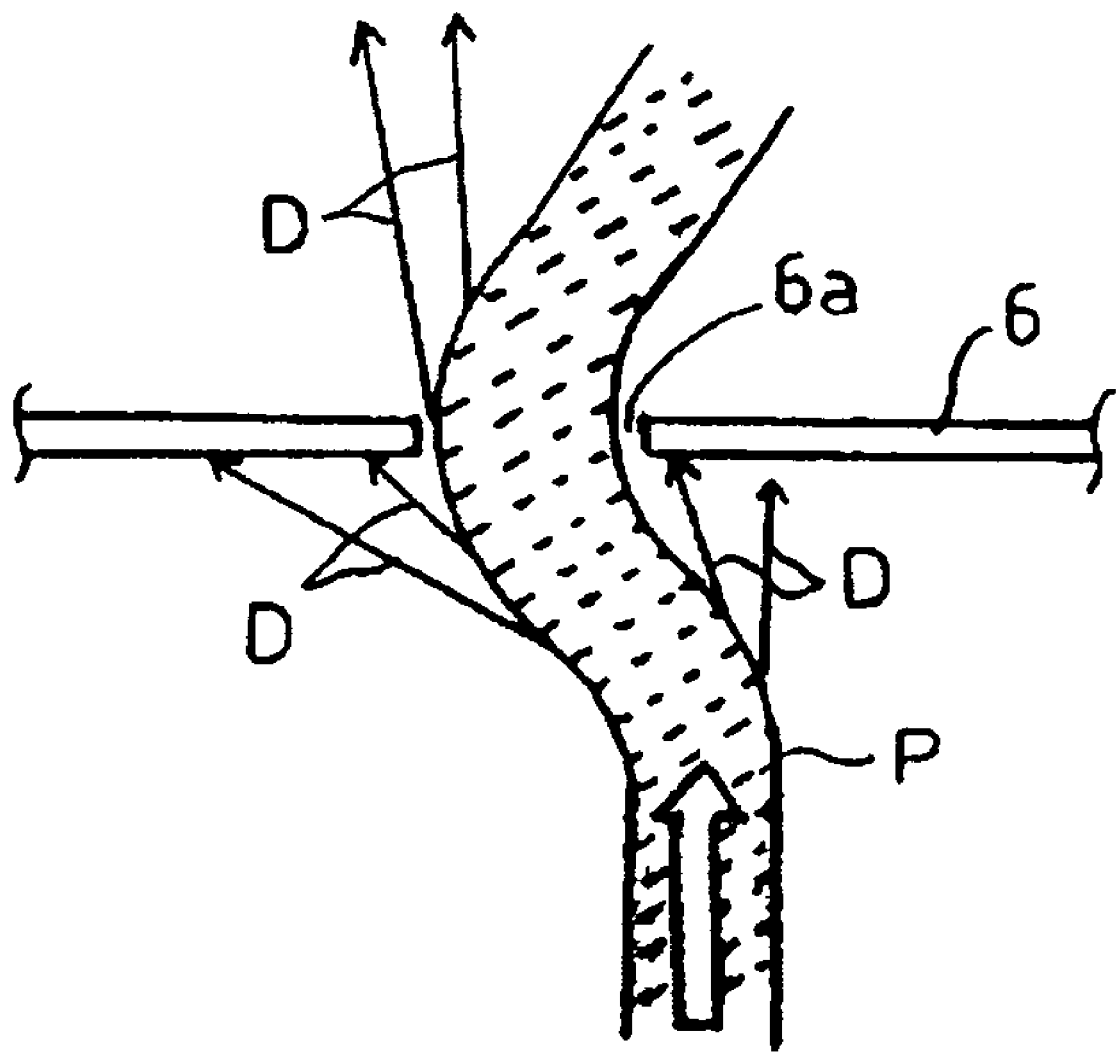
FIG. 2 is an explanatory diagram which shows a condition that the plasma passes through the eccentric passing hole of the aperture arranged in the tubular traveling passage.

FIG. 2 is the explanatory diagram that shows the condition that the plasma passes through the eccentric passing hole of the aperture arranged in the tubular traveling passage. As shown in FIG. 2, when the plasma P passes curvedly through the eccentric passing hole 6a of the aperture 6 arranged in the tubular traveling passage 3, small droplets D traveling with said plasma P jump out in the outside at the time of curving of said plasma P. Small droplets D jumping out in the starting end side collide with the wall surface of the aperture 6 and are removed. Small droplets D jumping out in the termination end side collide with the wall surface of the aperture 6 of the termination end side not shown in the diagram and are removed.

Figure 3:
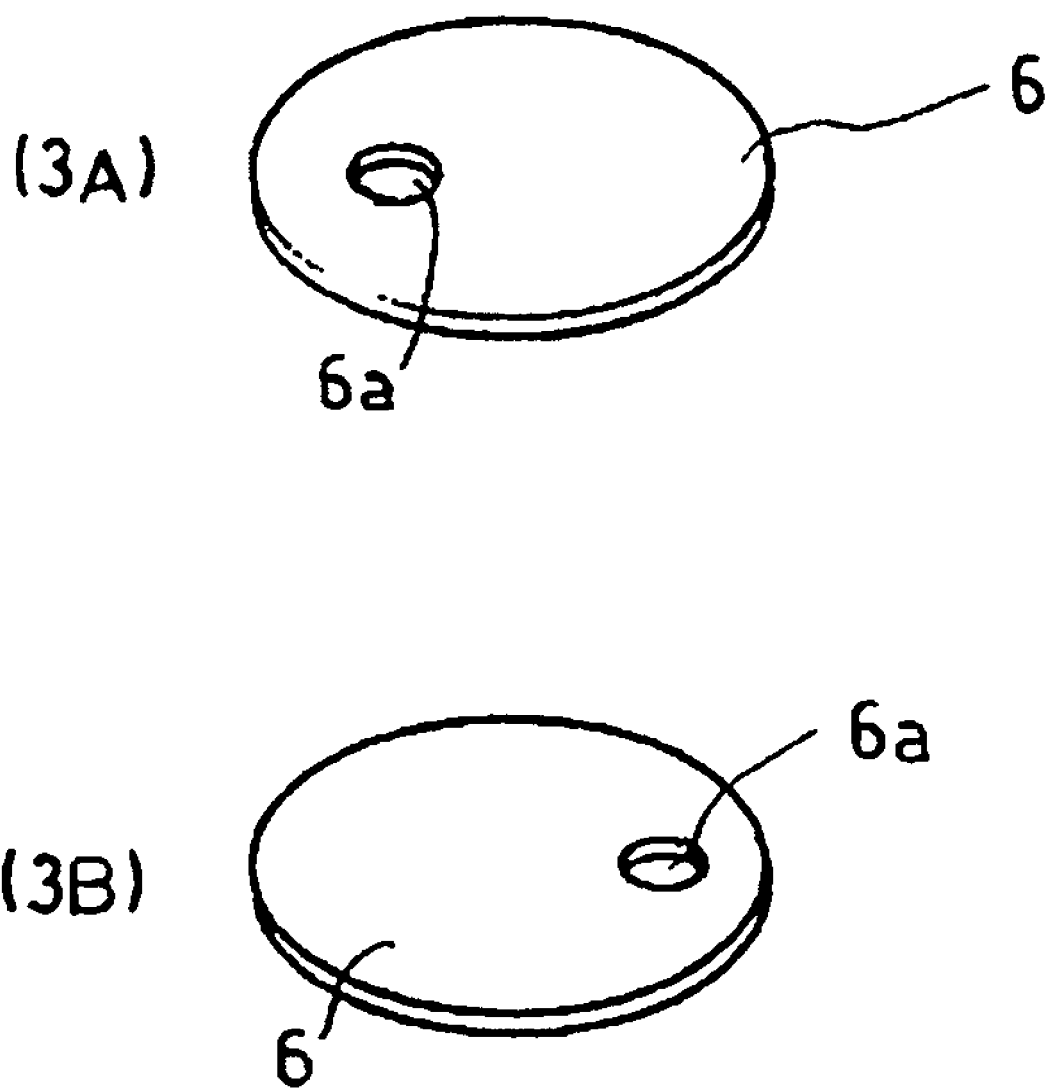
FIG. 3 shows a perspective diagram of the aperture arranged in the tubular traveling passage, (3A) is a perspective diagram of the aperture having the eccentric passing hole at the left side, and (3B) is a perspective diagram of the aperture having the eccentric passing hole at the right side.

FIG. 3 shows the perspective diagram of the aperture arranged in the tubular traveling passage, (3A) is a perspective diagram of the aperture having the eccentric passing hole at the left side, and (3B) is a perspective diagram of the aperture having the eccentric passing hole at the right side. As shown in (3A), the eccentric passing hole 6a is formed at the left side of the drawing for the aperture 6 arranged at the starting end side of the tubular traveling passage 3, so that the plasma P passes curvedly through the eccentric passing hole 6a of said left side at the starting end side. As shown in (3B), the eccentric passing hole 6a is formed at the right side of the drawing for the aperture 6 arranged at the termination end side of the tubular traveling passage 3, so that the plasma P passes curvedly through the eccentric passing hole 6a of said right side at the termination end side.

Figure 4:
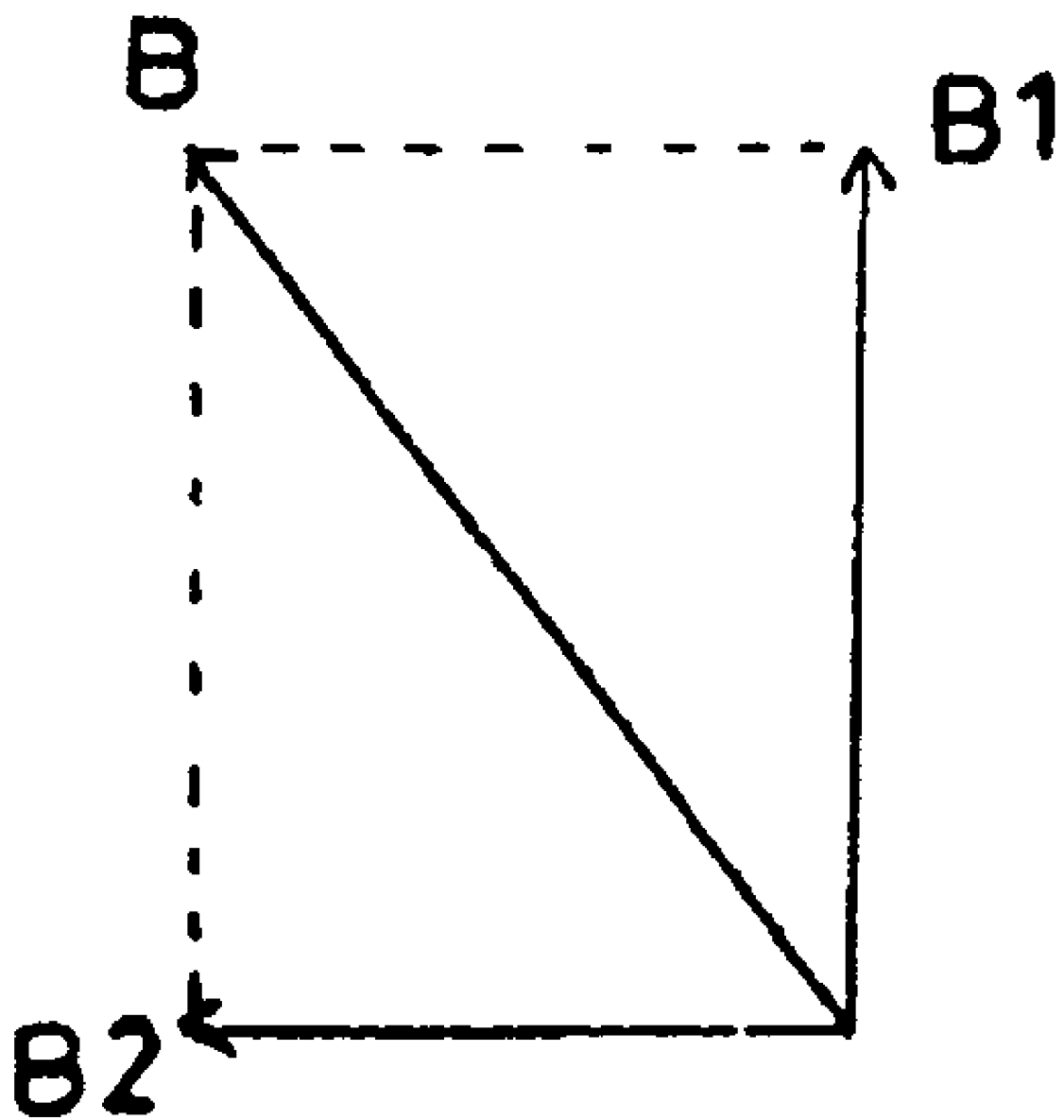
FIG. 4 is an explanatory diagram of the slant magnetic field resulting from traveling magnetic field and radial direction magnetic field in the tubular traveling passage.

FIG. 4 is the explanatory diagram of the slant magnetic field resulting from the traveling magnetic field and the radial direction magnetic field in the tubular traveling passage. As shown in FIG. 4, the traveling magnetic field B1 is generated by the electromagnet 8 arranged on the outer circumferential surface of the tubular traveling passage 3, and the radial direction magnetic field B2 is formed by the permanent magnet 9. The slant magnetic field B is formed by composition of these traveling magnetic field B1 and radial direction magnetic field B2. The plasma P is guided by said slant magnetic field B, and passes through the eccentric passing hole 6a of the aperture 6.

Figure 5:
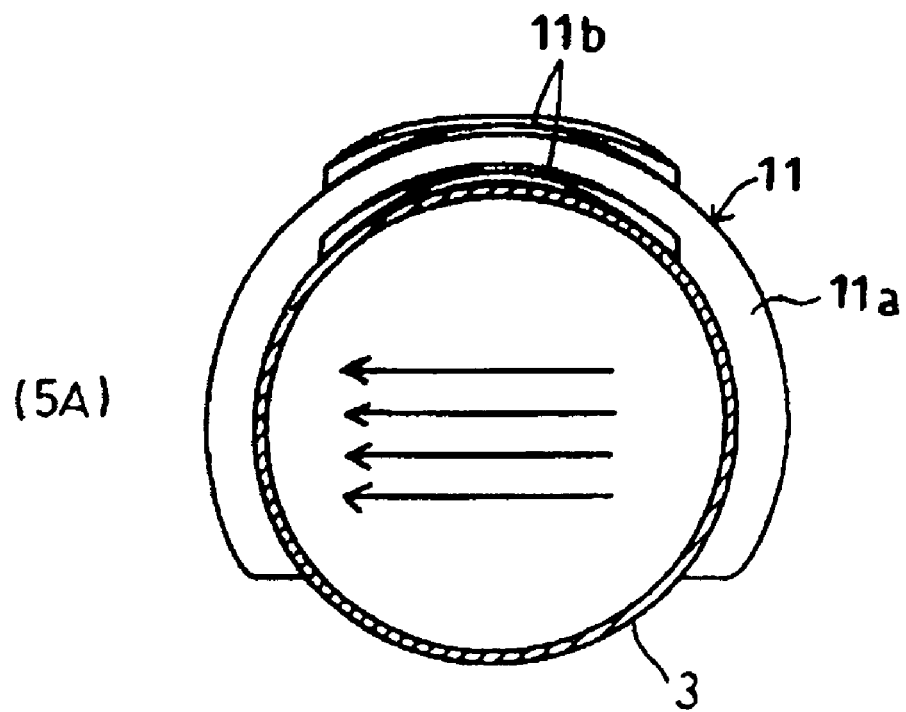
Figure 5:
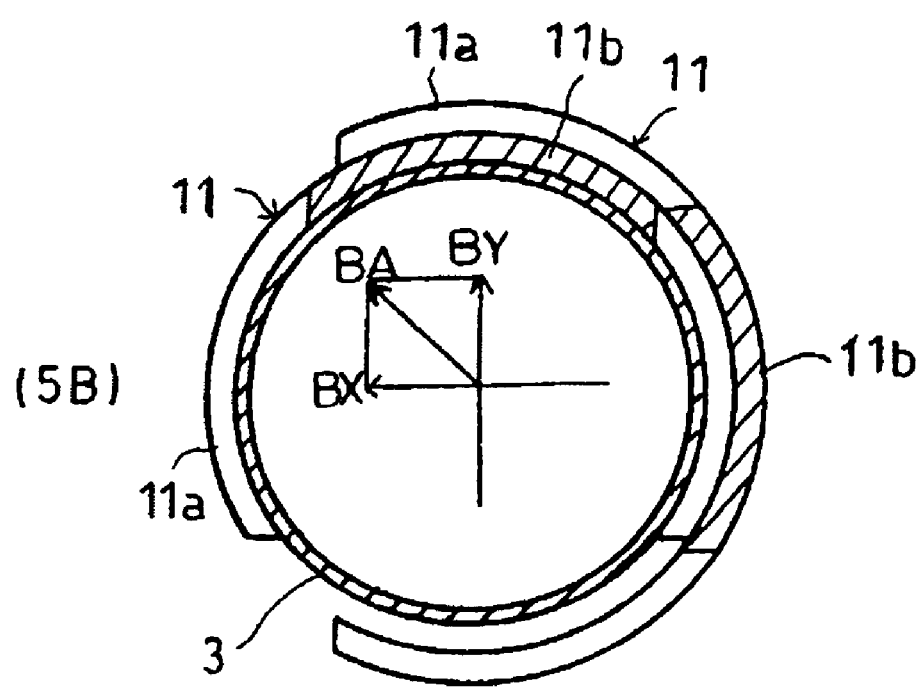

FIG. 5 is the explanatory diagram of the radial direction magnetic field due to the horseshoe-shaped magnetic body wound with coil. FIG. (5A) is the explanatory diagram of the radial direction magnetic field due to one horseshoe-shaped magnetic body, and FIG. (5B) is the explanatory diagram of the radial direction magnetic field due to two sets of horseshoe-shaped magnetic body. As shown in (5A), said horseshoe-shaped magnetic body 11 is constructed from the main body section 11a formed in the almost circular arc-like U-shape and the coil 11b wound with the circumference-directional central portion of said main body section 11a. By flowing the electric current through said coil 11b, the N pole occurs at one side of said main body section 11a and the S pole occurs at the other side. By means of using said horseshoe-shaped magnetic body 11 instead of the permanent magnet 9, the radial direction magnetic field can be generated in the tubular traveling passage 3. As shown in (5B), when the magnetic fields generated by two horseshoe-shaped magnetic bodies 11, 11 are perpendicular each other, the radial direction magnetic fields BX and BY occur in the X-X axial direction and the Y-Y axial direction, respectively. The slanting resultant magnetic field BA is formed by composition of these radial direction magnetic fields BX, BY Therefore, the plasma can be guided to the eccentric passing hole 6a of said aperture 6 by this resultant magnetic field BA.

FIG. 6 is the sectional outlined diagram of the tubular traveling passage on which two sets of radial direction electromagnet forming the radial direction magnetic field are disposed with right angle or almost right angle in X-X axial direction and Y-Y axial direction. As shown in FIG. 6, the radial direction magnetic fields BX, BY due to two sets of radial direction electromagnet 12A, 12B disposed in X-X axial direction and Y-Y axial direction generate to be perpendicular or almost perpendicular each other. Since the direction and strength of said radial direction magnetic fields BX, BY are adjusted by the current intensity and current direction flowing through said radial direction electromagnets 12A, 12B, the slant angle and strength of the resultant magnetic field BA are set freely. Therefore, the preferred resultant magnetic field BA to induce the plasma to the eccentric passing hole 6a of the aperture 6 can be formed. For example, by increasing the turn number of the coil of one electromagnet 12A or 12B, or by increasing the coil current, the direction of the resultant magnetic field BA can be brought close to the radial direction magnetic field BX of the electromagnet 12A or the radial direction magnetic field BY of the electromagnet 12B. Therefore, it becomes easily to change (adjust) the direction (strength) of the resultant magnetic field, and then it is possible to form the preferred resultant magnetic field BA in accordance with the position of the eccentric passing hole 6a of said aperture 6.

FIG. 7 is the sectional outlined diagram of the tubular traveling passage on which two sets of permanent magnet forming the radial direction magnetic field are disposed with right angle in X-X axial direction and Y-Y axial direction. As shown in FIG. 7, when the magnetic poles of two sets of permanent magnets 9A, 9B are perpendicular or almost perpendicular, the radial direction magnetic fields BX, BY occur in X-X axial direction and Y-Y axial direction, respectively. The slanting resultant magnetic field BA is formed by composition of these radial direction magnetic fields BX, BY. Therefore, the magnetic field guiding the plasma to the eccentric passing hole 6a of the aperture 6 is formed from the resultant magnetic field BA.

FIG. 8 is the sectional schematic diagram showing the plasma generator including the droplet removing device of the second embodiment. In addition, the same numerals are given to the same members or same portions as in the first embodiment, and their explanation is omitted. As shown in FIG. 8, in this second embodiment, the slant electromagnet 12 is arranged to be slanted in the outside of the electromagnet 8 disposed on the outer circumferential surface of the tubular traveling passage 3 composing the droplet removing device. The slant electromagnet 12a of the starting end side is formed so as to dispose the left side at the starting end side and to dispose the right side at the termination end side. Additionally, the slant electromagnet 12b of the termination end side is formed so as to dispose the right side at the starting end side and to dispose the left side at the termination end side.

Therefore, in the starting end side, the slant magnetic field is formed in left-of-center of the diagram, and in the termination end side, the slant magnetic field is formed in right-of-center of the diagram. According to this, the aperture 6 having the eccentric passing hole 6a at the left side is arranged at the starting end side of the tubular traveling passage 6, and the aperture 6 having the eccentric passing hole 6a at the right side is arranged at the termination end side. In addition, the traveling of the plasma P and the removal effect of the droplets D are similar to the first embodiment, and their explanations are omitted.

FIG. 9 is the sectional schematic diagram showing the plasma generator including the droplet removing device of the third embodiment. Still, the same numerals are given to the same members or same portions in the first and second embodiments, and their explanations are omitted. As shown in FIG. 9, the apertures are arranged on three places in this third embodiment, in which more one aperture 6 having the eccentric passing hole 6a at the left side is arranged at more termination end side in the tubular traveling passage 3 of said second embodiment. In addition, the slant electromagnet 12c is arranged on the outer circumference of the tubular traveling passage 3 in which the aperture 6 of this termination end side is disposed. Small droplets D traveling with the plasma P passing curvedly through the central aperture 6 jump out in the outside by curvedly passing of the plasma P, so that they collide with the wall surface of the aperture 6 of the termination end side, and are removed. Therefore, the surface of the article being processed T arranged in the plasma processing section 5 can be treated by the plasma P of higher purity not containing the droplets.

FIG. 10 is the sectional schematic diagram showing the plasma generator including the droplet removing device of the fourth embodiment. In addition, the same numerals are given to the same members or same portions in said first and second embodiments, and their explanations are omitted. As shown in FIG. 10, in this fourth embodiment, the droplet traveling passage 13 is arranged to communicate ahead of the main traveling passage 2, and the supplemental traveling passage 14 is installed to communicate inflectionally in the vertical direction between the main traveling passage 2 and the tubular traveling passage 3. Additionally, the electromagnets for inflection 15 are slantingly arranged on the outer circumferential surface of the starting end side of the droplet traveling passage 13 and the outer circumferential surface of the starting end side of the supplemental traveling passage 14. Moreover, the electromagnet for traveling 17 is arranged on the outer circumference of the supplemental traveling passage 14. Furthermore, the slant electromagnet 12a, 12b are arranged on the outer circumference of the tubular traveling passage 3.

Therefore, big droplets D going straight from the main traveling passage 2 are removed by traveling into the droplet traveling passage 13, and small droplets D traveling with the plasma P advancing in the supplemental traveling passage 14 are removed by colliding with the wall surface of two apertures 6 in the tubular traveling passage 3. According to this fourth embodiment, since big droplets D are removed by going straight toward the droplet traveling passage 13, the plasma P arriving at the surface of the article being processed T in the plasma processing section 5 becomes to have the very high purity after passing through the tubular traveling passage 3. Therefore, the surface of the article being processed T can be treated with very high accuracy.

FIG. 11 is the sectional schematic diagram showing the plasma generator including the droplet removing device of the fifth embodiment. Still, the same numerals are given to the same members or same portions in said first embodiment, and their explanations are omitted. As shown in FIG. 11, according to this fifth embodiment, the droplet traveling passage 13 is arranged to communicate ahead of the main traveling passage 2, and the supplemental traveling passage 14 is installed to connect inflectionally in the vertical direction between the main traveling passage 2 and the tubular traveling passage 3. In addition, the electromagnets for inflection 15 are slantingly arranged on the outer circumferential surface of the starting end side of the supplemental traveling passage 14 and the outer circumferential surface of the starting end side of the droplet traveling passage 13. Moreover, the permanent magnet 9 is arranged at the starting end side and the termination end side on the outer circumference of the tubular traveling passage 3.

Therefore, big droplets D going straight from the main traveling passage 2 are removed by traveling into the droplet traveling passage 13, and small droplets D traveling with the plasma P advancing in the supplemental traveling passage 14 are removed by colliding with the wall surface of two apertures 6 in the tubular traveling passage 3. According to this fifth embodiment, since big droplets D are removed by going straight toward the droplet traveling passage 13, the plasma P arriving at the surface of the article being processed T in the plasma processing section 5 becomes to have very high purity after passing through the tubular traveling passage 3. Therefore, the surface of the article being processed T can be treated with very high accuracy.

It is needless to say that the present invention is not limited to the above-described embodiments and modifications; various modifications and design changes, etc. are included in the scope of the present invention within the limits which do not deviate from the technical spirit of the present invention.

INDUSTRIAL APPLICABILITY

The droplet removing device in plasma generator concerning the present invention can be principally employed as the plasma processing device used for industries. By way of example only, it can be preferably used to the surface treatment processing by which a coating film is formed on the surface of the article being processed of metal or nonmetal. The material and geometry of these articles being processed are arbitrary, and the protection film can be gracefully formed on the surface of said article being processed.

The invention claimed is:

1. In a droplet removing device in a plasma generator by which a plasma is generated by a vacuum arc discharge performed in an arc discharge section set under a vacuum atmosphere and cathode material particles (referred to as droplets) produced subsidiarity from a cathode at a time of plasma generation are removed, said droplet removing device in said plasma generator characterized in that a tubular traveling passage through which said plasma and said droplets travel under mixed state is formed, one or more aperture having a passing hole at an eccentric position is provided in said tubular traveling passage, and a magnetic field generating means for passing said plasma through said eccentric passing hole of said aperture is arranged on an outer circumference of said tubular traveling passage, wherein said plasma passes through said eccentric passing hole of said aperture after being curved in said tubular traveling passage by a magnetic field generated from said magnetic field generating means, said droplets are separated from said plasma at the time of bending and removed by colliding against a wall face of said aperture.

2. The droplet removing device in the plasma generator according to claim 1, wherein a plurality of said apertures are arranged in said tubular traveling passage, said eccentric passing holes next to each other are disposed for their positions to be shifted relative to each other, said droplets passing through said eccentric passing hole of an upstream side aperture with said plasma are removed by collision against said wall surface of a next aperture, so that said plasma can pass through said eccentric passing hole of said next aperture.

3. The droplet removing device in the plasma generator according to claim 1, wherein said magnetic field generating means consists of a slant magnetic field generator by which a slant magnetic field is formed in a direction slanted for an axial direction of said tubular traveling passage and said plasma can pass through said eccentric passing hole of said aperture by said slant magnetic field.

4. The droplet removing device in the plasma generator according to claim 3, wherein said slant magnetic field generator is formed by an electromagnet or a permanent magnet arranged in a slant shape on an outer circumferential surface of said tubular traveling passage.

5. The droplet removing device in the plasma generator according to claim 3, wherein said slant magnetic field generator is constructed from a traveling magnetic field generator generating a traveling magnetic field and a radial direction magnetic field generator generating a radial direction magnetic field, so that said slant magnetic field is formed by composition of said traveling magnetic field and said radial direction magnetic field, and said plasma can pass curvedly through said eccentric passing hole of said aperture by said slant magnetic field.

6. The droplet removing device in the plasma generator according to claim 5, wherein said radial direction magnetic field generator is composed of two sets disposed with right angle or almost right angle in X-X axial direction and Y-Y axial direction on said outer circumference of said tubular traveling passage.

7. The droplet removing device in the plasma generator according to claim 5, wherein said traveling magnetic field generator is formed by an electromagnet arranged on said outer circumferential surface of said tubular traveling passage and said radial direction magnetic field generator is formed by a permanent magnet.

8. The droplet removing device in the plasma generator according to claim 5, wherein said traveling magnetic field generator is formed by an electromagnet arranged on said outer circumferential surface of said tubular traveling passage and said radial direction magnetic field generator is formed by a horseshoe-shaped magnetic body wound with a coil.

9. The droplet removing device in the plasma generator according to any one of claims 1 to 8, wherein a main traveling passage is arranged at a base end side of said tubular traveling passage and a droplet traveling passage, in which said droplets travel in a straight direction from said main traveling passage, is disposed, and a supplemental traveling passage is disposed to be curvedly communicated between said main traveling passage and said tubular traveling passage, so that said plasma travels curvedly in said supplemental traveling passage toward said tubular traveling passage.

10. In a droplet removing method in a plasma generator by which a plasma is generated by a vacuum arc discharge performed in an arc discharge section set under a vacuum atmosphere and cathode material particles (referred to as droplets) produced subsidiarily from a cathode at a time of plasma generation are removed, said droplet removing method in said plasma generator characterized in that an aperture having an eccentric passing hole is provided in a tubular traveling passage through which said plasma and said droplets travel under mixed state, a slant magnetic field is formed in a direction slanted for an axial direction of said tubular traveling passage, said plasma passes through said eccentric passing hole of said aperture by being curved with said slant magnetic field, so that said plasma and said droplets are separated and said droplets are removed by colliding against a wall surface of said aperture.

* * * * *